(12) United States Patent
Wada et al.

(10) Patent No.: US 8,878,192 B2
(45) Date of Patent: Nov. 4, 2014

(54) SILICON CARBIDE SEMICONDUCTOR DEVICE

(71) Applicant: Sumitomo Electric Industries, Ltd., Osaka (JP)

(72) Inventors: Keiji Wada, Osaka (JP); Toru Hiyoshi, Osaka (JP); Takeyoshi Masuda, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 13/863,043

(22) Filed: Apr. 15, 2013

(65) Prior Publication Data

US 2013/0306986 A1 Nov. 21, 2013

Related U.S. Application Data

(60) Provisional application No. 61/649,096, filed on May 18, 2012.

(30) Foreign Application Priority Data

May 18, 2012 (JP) .................................. 2012-113939

(51) Int. Cl.

| | |
|---|---|
| *H01L 29/15* | (2006.01) |
| *H01L 21/3065* | (2006.01) |
| *H01L 29/739* | (2006.01) |
| *H01L 29/66* | (2006.01) |
| *H01L 29/08* | (2006.01) |
| *H01L 29/06* | (2006.01) |
| *H01L 29/78* | (2006.01) |
| *H01L 29/04* | (2006.01) |
| *H01L 29/16* | (2006.01) |
| *H01L 29/10* | (2006.01) |
| *H01L 29/423* | (2006.01) |

(52) U.S. Cl.
CPC ........... *H01L 29/0661* (2013.01); *H01L 29/045* (2013.01); *H01L 21/3065* (2013.01); *H01L 29/7397* (2013.01); *H01L 29/66068* (2013.01); *H01L 29/0878* (2013.01); *H01L 29/1608* (2013.01); *H01L 29/1095* (2013.01); *H01L 29/4236* (2013.01); *H01L 29/7813* (2013.01)
USPC ............................................ 257/77; 257/330

(58) Field of Classification Search
USPC .................... 257/77, 330, 339, 409, 655, 628
See application file for complete search history.

(56) References Cited

U.S. PATENT DOCUMENTS

| | | | | |
|---|---|---|---|---|
| 5,506,421 | A | * | 4/1996 | Palmour ........................... 257/77 |
| 5,939,752 | A | * | 8/1999 | Williams ........................ 257/339 |
| 2007/0252172 | A1 | | 11/2007 | Hayashi et al. |
| 2009/0114969 | A1 | | 5/2009 | Suzuki et al. |
| 2010/0314626 | A1 | | 12/2010 | Harada et al. |

FOREIGN PATENT DOCUMENTS

| | | |
|---|---|---|
| JP | 11-177086 | 7/1999 |
| JP | 2007-299861 | 11/2007 |

(Continued)

OTHER PUBLICATIONS

International Search Report and Written Opinion in PCT International Application No. PCT/JP2013/060608, dated Jul. 9, 2013.

*Primary Examiner* — Mark Prenty
(74) *Attorney, Agent, or Firm* — Venable LLP; Steven J. Schwarz; George L. Howarah

(57) ABSTRACT

A silicon carbide substrate includes a first layer of a first conductivity type, a second layer of a second conductivity type provided on the first layer, and a third layer provided on the second layer and doped with an impurity for providing the first conductivity type. The silicon carbide substrate has a trench formed through the third layer and the second layer to reach the first layer. The first layer has a concentration peak of the impurity in a position away from the trench in the first layer. As a result, a silicon carbide semiconductor device having an electric field relaxation structure that can be readily formed is provided.

9 Claims, 12 Drawing Sheets

(56) References Cited

FOREIGN PATENT DOCUMENTS

| | | |
|---|---|---|
| JP | 2008-270681 A | 11/2008 |
| JP | 2009-117593 A | 5/2009 |
| JP | 2012-038771 A | 2/2012 |
| WO | WO-2008/062729 A1 | 5/2008 |

* cited by examiner

SILICON CARBIDE SEMICONDUCTOR DEVICE

BACKGROUND OF THE INVENTION

1. Field of the Invention

The present invention relates to silicon carbide semiconductor devices, and particularly to a silicon carbide semiconductor device including a silicon carbide substrate having a trench.

2. Description of the Background Art

The breakdown phenomenon in a gate insulating film is considered to be a main factor likely to cause a breakdown in a silicon carbide semiconductor device having a trench gate insulating film. As disclosed in Japanese Patent Laying-Open No. 2009-117593, for example, breakdown of a gate insulating film in a corner portion of a trench due to an electric field is recognized as a problem for a trench type MOSFET (Metal Oxide Semiconductor Field Effect Transistor) made of silicon carbide.

According to the technique described in the above publication, a $p^+$ type deep layer deeper than the trench is provided in order to relax the electric field. For this purpose, a trench for providing the $p^+$ type deep layer is formed, followed by epitaxial growth to fill this trench. In another technique according to Japanese Patent Laying-Open No. 2008-270681, for example, a $p^+$ region is provided at the bottom of a trench by ion implantation.

According to the technique described in Japanese Patent Laying-Open No. 2009-117593, the step of forming the trench for the $p^+$ type deep layer and the step of filling this trench are required. In other words, burdensome steps of fine processing and epitaxial growth are required.

According to the technique described in Japanese Patent Laying-Open No. 2008-270681, the ion implantation for forming the $p^+$ region needs to be selectively performed into the bottom of the trench. This $p^+$ region may become connected to a p region forming a channel in the trench due to manufacturing variations. In this case, a channel structure is substantially altered, causing a major disturbance in characteristics of a semiconductor device. This problem will become more pronounced as the size of the trench is further reduced.

SUMMARY OF THE INVENTION

The present invention has been made to solve the problems such as described above, and an object of the present invention is to provide a silicon carbide semiconductor device having an electric field relaxation structure that can be readily formed.

A silicon carbide semiconductor device according to the present invention includes a silicon carbide substrate, a gate insulating film, and a gate electrode. The silicon carbide substrate includes a first layer of a first conductivity type, a second layer of a second conductivity type provided on the first layer, and a third layer provided on the second layer and doped with an impurity for providing the first conductivity type. The silicon carbide substrate has a trench formed through the third layer and the second layer to reach the first layer. The first layer has a concentration peak of the impurity in a position away from the trench in the first layer. The gate insulating film covers the trench. The gate electrode is provided on the gate insulating film. The gate electrode faces a surface of the second layer, with the gate insulating film interposed therebetween.

According to the above-described silicon carbide semiconductor device, the structure formed in the vicinity of the trench for relaxing the electric field is the above-described concentration peak of the impurity in the first layer, rather than the formation of a region of the second conductivity type different from the first conductivity type of the first layer. Thus, there is no possibility that such region of the second conductivity type comes too close to, or becomes connected to, the second layer of the second conductivity type due to manufacturing variations. Thus, a step that requires high accuracy is not necessary. As a result, the electric field relaxation structure can be readily formed.

The second layer may have a concentration peak of the impurity in a position away from the trench in the second layer. As a result, the effect of the impurity on channel characteristics can be suppressed compared to a case where the concentration peak of the impurity is on the surface of the trench.

The concentration of the impurity in the first layer at the bottom of the trench may be not less than a minimum value of the concentration of the impurity in the first layer, and not more than 110% of the minimum value. As a result, the electric field can be relaxed more sufficiently.

At the bottom of the trench, a profile of the concentration peak of the impurity may have a dose amount of not less than $1 \times 10^{11}/\text{cm}^2$. As a result, the electric field can be relaxed more sufficiently.

The silicon carbide substrate may be made of silicon carbide having a hexagonal crystal structure of polytype 4H. As a result, a material more suitable for a power semiconductor device can be used.

Preferably, the surface of the second layer includes a first plane having a plane orientation of $\{0\text{-}33\text{-}8\}$. More preferably, the surface includes the first plane microscopically, and further includes a second plane having a plane orientation of $\{0\text{-}11\text{-}1\}$ microscopically. Preferably, the first and second planes of the surface form a combined plane having a plane orientation of $\{0\text{-}11\text{-}2\}$. More preferably, the surface macroscopically has an off angle of $62°\pm10°$ relative to the $\{000\text{-}1\}$ plane.

According to the present invention as described above, the electric field relaxation structure can be readily formed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The embodiments of the present invention will be described hereinafter with reference to the drawings. It is noted that the same or corresponding parts are designated by the same reference numbers in the following drawings, and description thereof will not be repeated. Regarding crystallographic descriptions in the present specification, an individual orientation is represented by [ ], a group orientation is represented by <>, an individual plane is represented by ( ) and a group plane is represented by { }. In addition, although a negative crystallographic index is usually indicated by putting "−" (bar) above a numeral, it is indicated by putting a negative sign before the numeral in the present specification.

Figure 1:
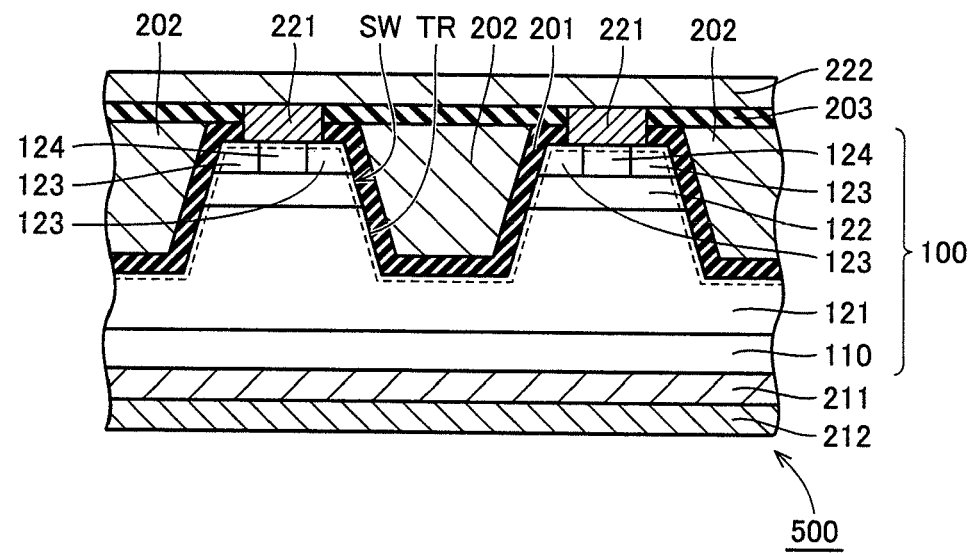
FIG. 1 is a partial cross-sectional view schematically showing the structure of a silicon carbide semiconductor device in one embodiment of the present invention.

As shown in FIG. 1, a vertical type MOSFET 500 (silicon carbide semiconductor device) in this embodiment includes an epitaxial substrate 100 (silicon carbide substrate), a gate oxide film 201 (gate insulating film), a gate electrode 202, an interlayer insulating film 203, a source electrode 221, a drain electrode 211, a source line 222, and a protection electrode 212.

Epitaxial substrate 100 has a single-crystal substrate 110 and an epitaxial layer provided thereon. Single-crystal substrate 110 is of n type (first conductivity type). The epitaxial layer includes an n⁻ layer 121 (first layer), a p type body layer 122 (second layer), an n region 123 (third layer), and a contact region 124.

N⁻ layer 121 is of n type (first conductivity type). N⁻ layer 121 has a donor concentration lower than in single-crystal substrate 110. The donor concentration in n⁻ layer 121 is preferably not less than $1 \times 10^{15}/cm^3$ and not more than $5 \times 10^{16}/cm^3$, and is set to $8 \times 10^{15}/cm^3$, for example. The donor concentration has a peak in the dashed line portion in the figure. The peak will be described later in detail.

P type body layer 122 is provided on n⁻ layer 121, and is of p type (second conductivity type). P type body layer 122 has an acceptor concentration of, for example, $1 \times 10^{18}/cm^3$. In this embodiment, p type body layer 122 is doped not only with an acceptor serving as an impurity for providing p type, but also with a donor serving as an impurity for providing n type. The effect of the donor is canceled by the acceptor doped in a higher concentration. The concentration distributions of the donor and the acceptor will be described later.

N region 123 is provided on p type body layer 122. Contact region 124 is of p type. Contact region 124 is formed on a portion of p type body layer 122 so as to be connected to p type body layer 122.

Epitaxial substrate 100 is made of silicon carbide. This silicon carbide preferably has a hexagonal crystal structure, and more preferably has a polytype 4H. Single-crystal substrate 110 has one main surface (upper surface in FIG. 1) having a plane orientation which preferably corresponds substantially to the (000-1) plane.

Figure 2:
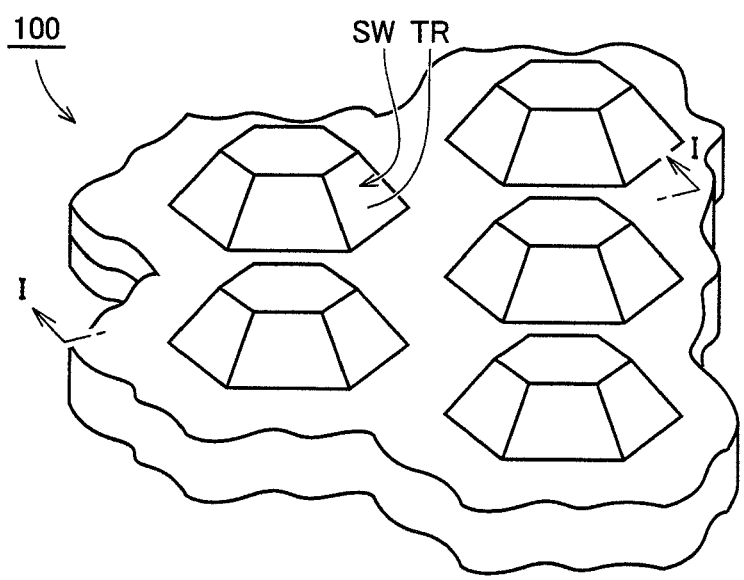
FIG. 2 is a perspective view schematically showing the shape of a silicon carbide substrate of FIG. 1.
Figure 3:
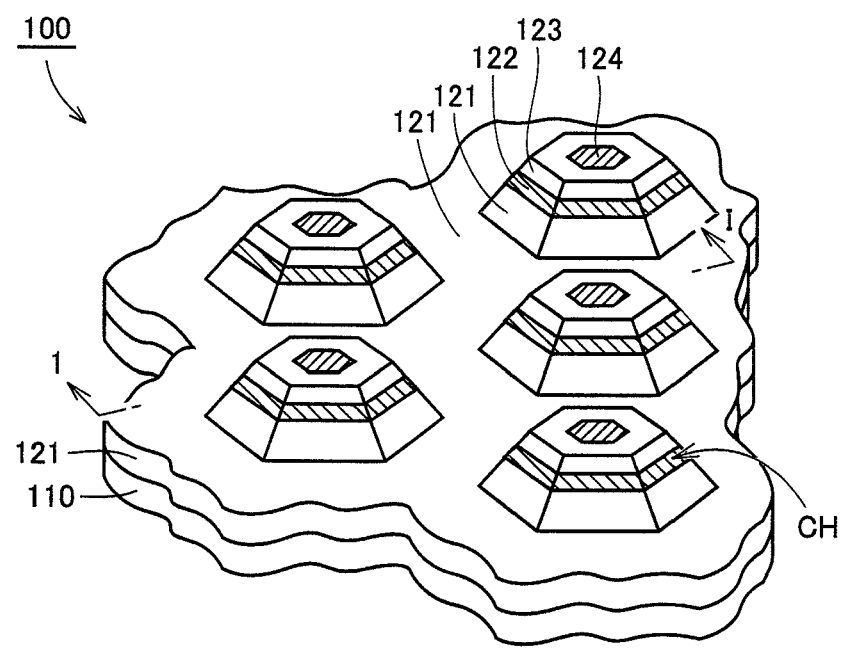
FIG. 3 is a diagram where p type surfaces are provided with hatching in the perspective view of FIG. 2.

Referring additionally to FIGS. 2 and 3, epitaxial substrate 100 has a trench TR formed through n region 123 and p type body layer 122 to reach n⁻ layer 121. Trench TR has a side wall having a surface SW. In this embodiment, trench TR further has a flat bottom. Surface SW includes a channel surface on p type body layer 122. Preferably, surface SW has a predetermined crystal plane (also referred to as "special plane"). The special plane will be described later in detail.

That epitaxial substrate 100 has trench TR corresponds to the fact that the epitaxial layer has been partially removed in the upper surface of single-crystal substrate 110. In this embodiment, a large number of mesa structures are formed on the upper surface of single-crystal substrate 110. Specifically, each mesa structure has an upper surface and a bottom surface each in a hexagonal shape, and has a side wall inclined relative to the upper surface of single-crystal substrate 110.

Gate oxide film 201 covers trench TR. Specifically, gate oxide film 201 is provided on surface SW and the bottom of trench TR. This gate oxide film 201 extends onto the upper surface of n region 123. Gate electrode 202 is provided on gate oxide film 201 to fill trench TR (that is, to fill the space between the mesa structures directly adjacent to each other). Gate electrode 202 faces surface SW of p type body layer 122, with gate oxide film 201 interposed therebetween. Gate electrode 202 has an upper surface substantially as high as the upper surface of a portion of gate oxide film 201 on the upper surface of n region 123. Interlayer insulating film 203 is provided to cover gate electrode 202 as well as the portion of gate oxide film 201 that extends onto the upper surface of n region 123.

Source electrode 221 is provided at the apex portion of each mesa structure. Source electrode 221 is in contact with each of contact region 124 and n region 123.

Source line 222 is in contact with source electrode 221, and extends on the upper surface of interlayer insulating film 203. Drain electrode 211 is an ohmic electrode provided on the backside surface of single-crystal substrate 110 opposite to its main surface on which n⁻ layer 121 is provided. Protection electrode 212 is provided on drain electrode 211.

The impurity concentration in epitaxial substrate 100 is now described in detail.

Figure 4:
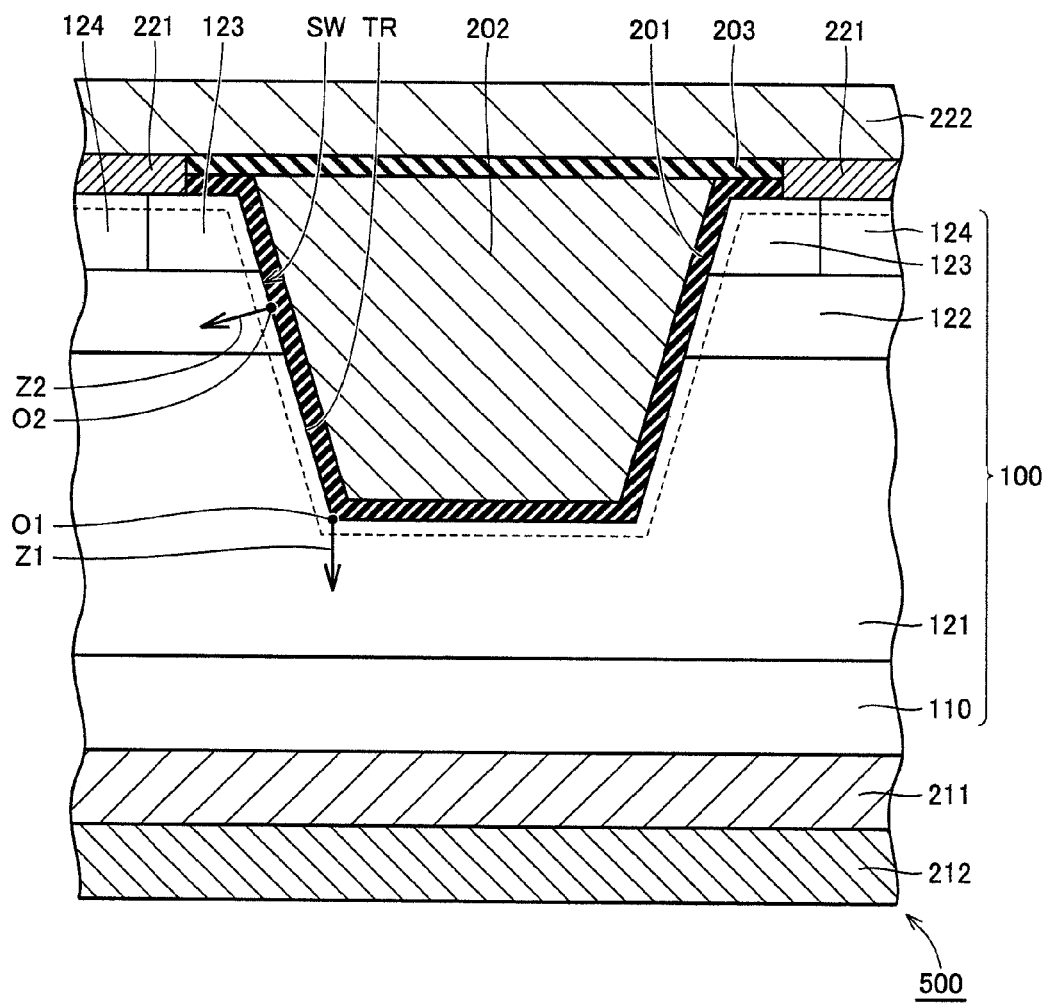
FIG. 4 is an enlarged view of FIG. 1.

Referring to FIG. 4, n⁻ layer 121 has a concentration peak of the donor along trench TR in a position away from trench TR, as indicated by the dashed line portion in n⁻ layer 121. P type body layer 122 may have a concentration peak of the donor along trench TR in a position away from trench TR, as indicated by the dashed line portion in p type body layer 122. N region 123 may have a concentration peak of the donor along trench TR in a position away from trench TR, as indicated by a portion of the dashed line portion in n region 123 (oblique portion of the dashed line portion in the figure). In addition, epitaxial substrate 100 may have a concentration peak of the donor along its main surface (upper surface in the figure), as indicated by a portion of the dashed line portion (upper portion in the figure). The concentration peak along the main surface may be positioned away from the main surface.

Figure 5:
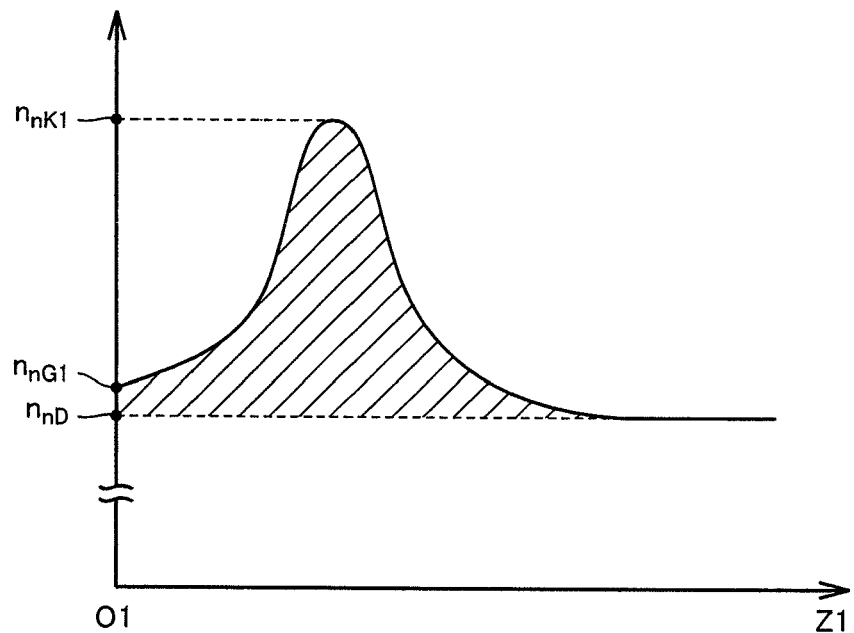
FIG. 5 is a donor concentration profile along an arrow Z1 in FIG. 4.

FIG. 5 shows an example of a donor concentration profile in n⁻ layer 121 along a depth direction Z1 (FIG. 4) from a point O1 (FIG. 4) at the bottom of trench TR. In this profile, a peak value $n_{nK1}$ exists in a position away from trench TR, that is, a position away from point O1. A depth position of peak value $n_{nK1}$ from point O1 is not less than 50 nm and not more than 1000 nm, for example. A concentration $n_{nG1}$ at point O1 is not less than a minimum value $n_{nD}$ of the concentration in n⁻ layer 121. Preferably, concentration $n_{nG1}$ is not more than 110% of minimum value $n_{nD}$. Preferably, peak value $n_{nK1}$ is not less than three times the minimum value $n_{nD}$.

At the bottom of trench TR, that is, in the vicinity of point O1 (FIG. 5), the profile of the concentration peak preferably has a dose amount of not less than $1\times10^{11}/cm^2$. The dose amount is a value (hatched area in FIG. 5) obtained by performing date processing of removing a background on the profile of the concentration peak, and then integrating a concentration value (atoms/cm³) in the direction of a horizontal axis Z1 of FIG. 5, namely, a thickness direction. If the impurity concentration has a substantially constant value in a portion except for the portion in the vicinity of trench TR in n⁻ layer 121, for example, the background removal may be implemented by subtracting this constant value. Alternatively, if the impurity concentration has a value that varies also in the portion except for the portion in the vicinity of trench TR in n⁻ layer 121, the background removal process may be performed by extrapolating the variation in impurity concentration in a portion sufficiently away from trench TR to the portion in the vicinity of trench TR. For the extrapolation, a first-order approximation can be used, for example, or a higher-order approximation can be performed as necessary.

N⁻ layer 121 may have a plurality of types of donors. For example, n⁻ layer 121 may include N (nitrogen) atoms substantially uniformly therein and P (phosphorus) atoms localized therein, to have the above concentration peak. In this case, the above dose amount may also be obtained by simple integration of the concentration profile of the P atoms.

Figure 6:
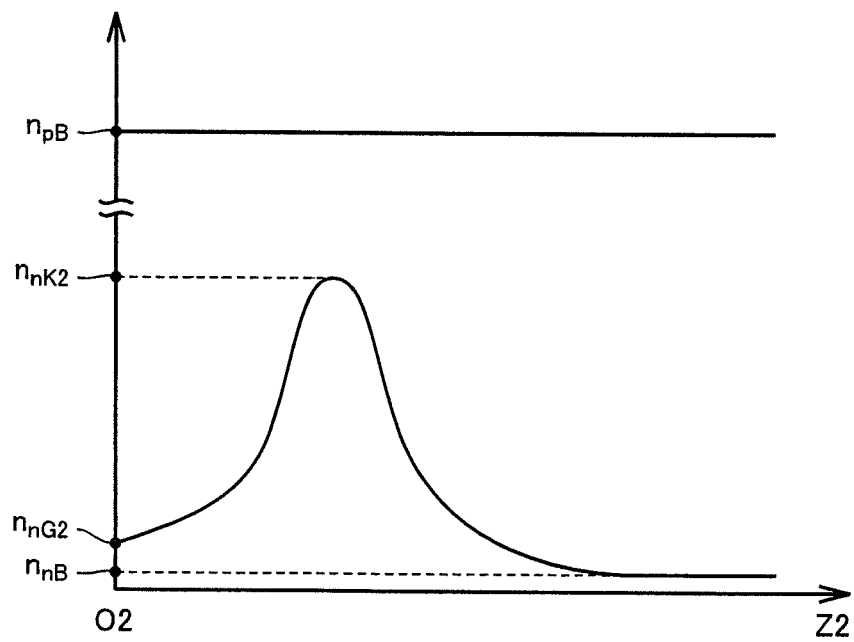
FIG. 6 is a donor concentration profile and an acceptor concentration profile along an arrow Z2 in FIG. 4.

FIG. 6 shows an example of a donor concentration profile (lower graph line in FIG. 6) and an acceptor concentration profile (upper graph line in FIG. 6) in p type body layer 122 from a point O2 (FIG. 4) at the side wall of trench TR in a direction Z2 (FIG. 4) substantially perpendicular to the side wall toward the inside of p type body layer 122. In this profile, a peak value $n_{nK2}$ of the donor exists in a position away from trench TR, that is, a position away from point O2. A donor concentration $n_{nG2}$ at point O2 is not less than a minimum value $n_{nB}$ of the donor concentration in p type body layer 122. Preferably, donor concentration $n_{nG2}$ is not more than 110% of minimum value $n_{nB}$. Since peak value $n_{nK2}$ of the donor concentration is lower than an acceptor concentration $n_{pB}$ in p type body layer 122, p type body layer 122 is of p type also in the peak position of the donor concentration. In addition, on the side wall of trench TR, that is, on point O2, donor concentration $n_{nG2}$ is sufficiently small compared to acceptor concentration $n_{pB}$. Consequently, a ratio of the acceptor canceled by the donor in the channel surface on the side wall of trench TR is to such an extent that does not substantially affect the channel characteristics. Donor concentration $n_{nG2}$ is preferably not more than 10%, and more preferably not more than 5%, of acceptor concentration $n_{pB}$.

A method of manufacturing MOSFET 500 is now described.

Figure 7:
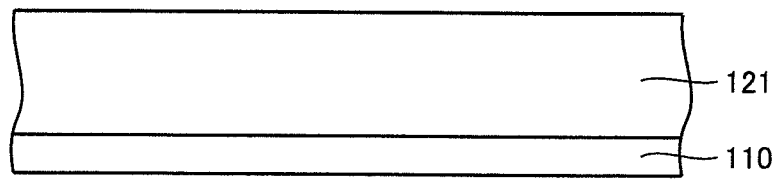
FIG. 7 is a partial cross-sectional view schematically showing a first step of a method of manufacturing the silicon carbide semiconductor device of FIG. 1.

As shown in FIG. 7, n⁻ layer 121 is formed by epitaxial growth on single-crystal substrate 110. This epitaxial growth can be implemented by CVD (Chemical Vapor Deposition) that utilizes a mixed gas of silane (SiH₄) and propane (C₃H₈) as a material gas and utilizes hydrogen gas (H₂) as a carrier gas, for example. In so doing, it is preferable to introduce nitrogen (N) or phosphorus (P), for example, as an impurity of n type conductivity.

Figure 8:
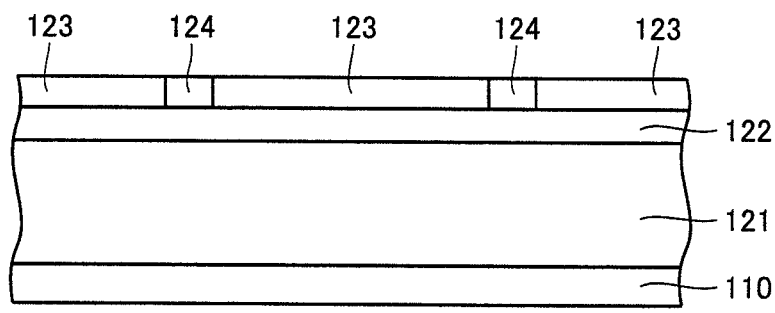
FIG. 8 is a partial cross-sectional view schematically showing a second step of the method of manufacturing the silicon carbide semiconductor device of FIG. 1.

As shown in FIG. 8, ions are implanted into the upper surface of n⁻ layer 121, to form p type body layer 122, n region 123 and contact region 124. In the ion implantation for forming p type body layer 122 and contact region 124, ions of an impurity for providing p type such as aluminum (Al) are implanted. In the ion implantation for forming n region 123, ions of an impurity for providing n type such as phosphorus (P) are implanted. It is noted that epitaxial growth may be performed instead of the ion implantation.

Figure 9:
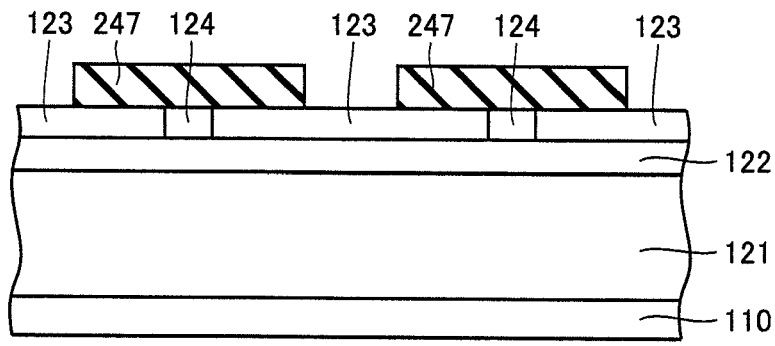
FIG. 9 is a partial cross-sectional view schematically showing a third step of the method of manufacturing the silicon carbide semiconductor device of FIG. 1.

As shown in FIG. 9, a mask layer 247 having an opening is formed on the surface consisting of n region 123 and contact region 124. For example, an insulating film such as a silicon oxide film can be used as mask layer 247. The opening is formed in a position corresponding to the position of trench TR (FIG. 1).

Figure 10:
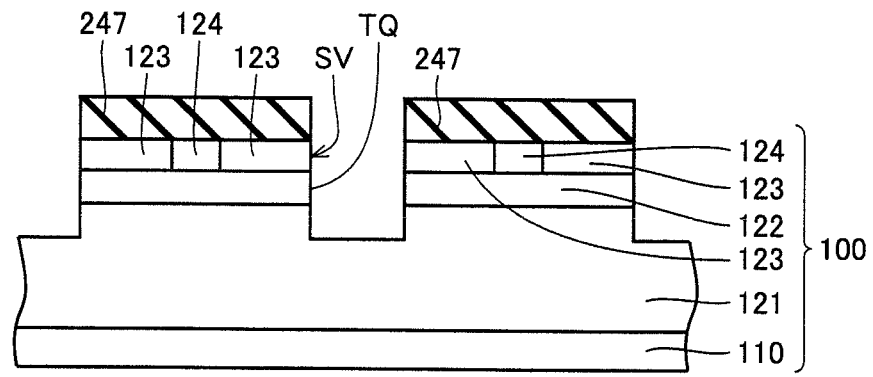
FIG. 10 is a partial cross-sectional view schematically showing a fourth step of the method of manufacturing the silicon carbide semiconductor device of FIG. 1.

As shown in FIG. 10, n region 123, p type body layer 122, and a portion of n⁻ layer 121 are removed by etching in the opening of mask layer 247. An exemplary, usable etching method is reactive ion etching (RIE), in particular, inductively coupled plasma (ICP) RIE. Specifically, for example, ICP-RIE can be used which employs SF₆ or a mixed gas of SF₆ and O₂ as the reactive gas. By means of such etching, in the region where trench TR (FIG. 1) is to be formed, a recess TQ can be formed which has a side wall having an inner surface SV substantially perpendicular to the main surface of single-crystal substrate 110.

Next, inner surface SV of recess TQ of epitaxial substrate 100 is thermally etched. The thermal etching can be performed, for example, by heating epitaxial substrate 100 in an atmosphere containing reactive gas having at least one or more types of halogen atom. The at least one or more types of halogen atom include at least one of chlorine (Cl) atom and fluorine (F) atom. This atmosphere is, for example, Cl₂, BCL₃, SF₆, or CF₄. For example, the thermal etching is performed using a mixed gas of chlorine gas and oxygen gas as a reactive gas, at a heat treatment temperature of, for example, not less than 700° C. and not more than 1000° C.

Figure 11:
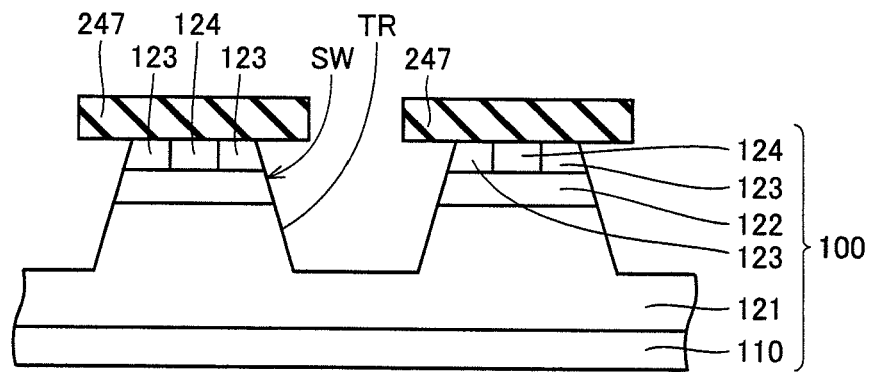
FIG. 11 is a partial cross-sectional view schematically showing a fifth step of the method of manufacturing the silicon carbide semiconductor device of FIG. 1.

As a result of the thermal etching, trench TR is formed as shown in FIG. 11. Here, as the side wall of trench TR, surface SW is formed which has portions respectively formed of n⁻ layer 121, p type body layer 122 and n region 123. In surface SW, the special plane is spontaneously formed.

Figure 12:
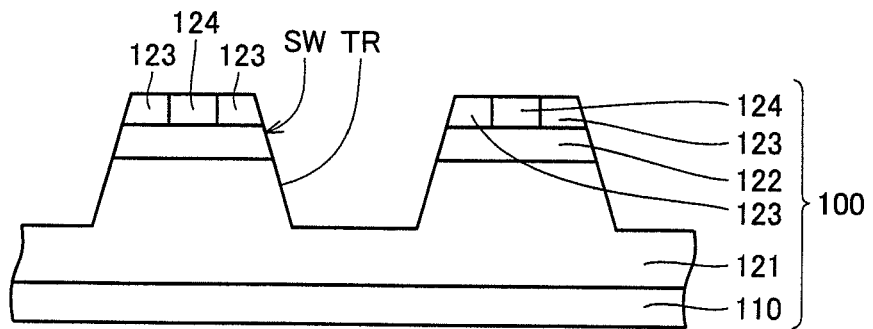
FIG. 12 is a partial cross-sectional view schematically showing a sixth step of the method of manufacturing the silicon carbide semiconductor device of FIG. 1.

It is noted that the reactive gas may contain a carrier gas in addition to the chlorine gas and the oxygen gas. An exemplary, usable carrier gas is nitrogen ($N_2$) gas, argon gas, helium gas, or the like. When the heat treatment temperature is set at not less than 700° C. and not more than 1000° C. as described above, a rate of etching SiC is approximately 70 μm/hour, for example. Moreover, in this case, mask layer 247, which is made of silicon oxide and therefore has a very large selection ratio relative to SiC, is not substantially etched during the etching of SiC. Next, mask layer 247 is removed with an appropriate method such as etching (FIG. 12).

Figure 13:
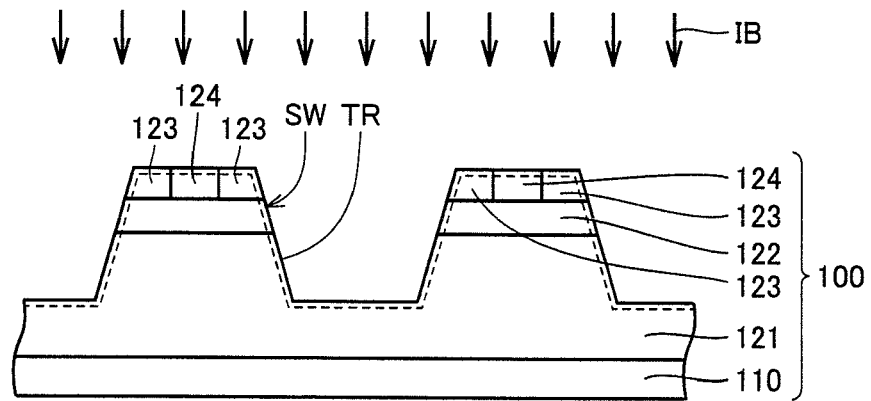
FIG. 13 is a partial cross-sectional view schematically showing a seventh step of the method of manufacturing the silicon carbide semiconductor device of FIG. 1.

As shown in FIG. 13, by means of ion implantation with an ion beam IB, the donor is implanted in such a manner that a concentration peak of the donor is positioned on the dashed line in the figure. This implantation does not particularly require a highly accurate mask, but can be performed without a mask as illustrated. A dose amount of the implantation is preferably not less than $1 \times 10^{11}/cm^2$, and is set to $1 \times 10^{12}/cm^2$, for example. The acceleration energy of the implantation is set to 400 keV, for example. The type of implanted ion is phosphorus, for example. Next, activation annealing is performed to activate the impurities implanted by the ion implantation.

Figure 14:
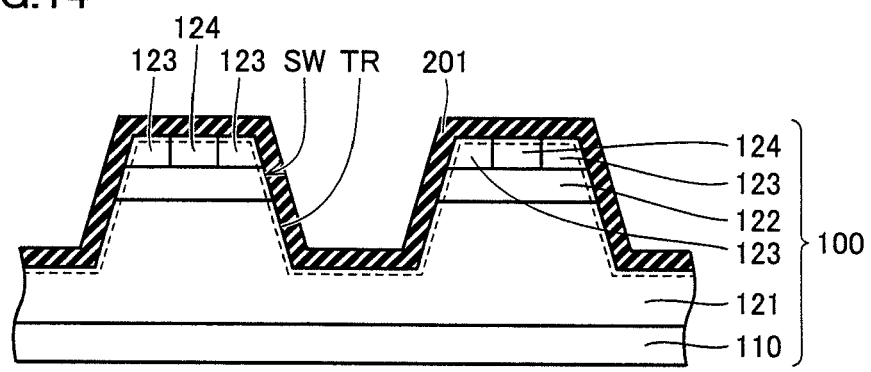
FIG. 14 is a partial cross-sectional view schematically showing an eighth step of the method of manufacturing the silicon carbide semiconductor device of FIG. 1.

As shown in FIG. 14, gate oxide film 201 is formed on a surface including surface SW, which is the side wall of trench TR, and the bottom thereof Gate oxide film 201 is obtained, for example, by thermally oxidizing the epitaxial layer made of silicon carbide.

Figure 15:
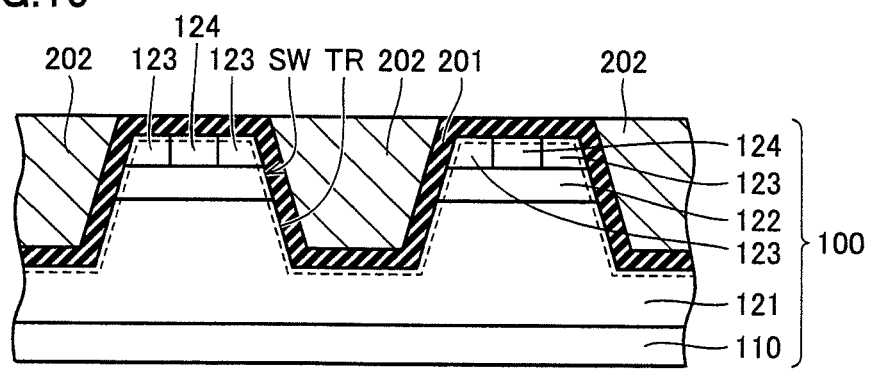
FIG. 15 is a partial cross-sectional view schematically showing a ninth step of the method of manufacturing the silicon carbide semiconductor device of FIG. 1.

As shown in FIG. 15, gate electrode 202 is formed to fill the region in trench TR, with gate oxide film 201 interposed therebetween. A method of forming gate electrode 202 can be performed, for example, by forming a film of conductor and performing CMP (Chemical Mechanical Polishing).

Figure 16:
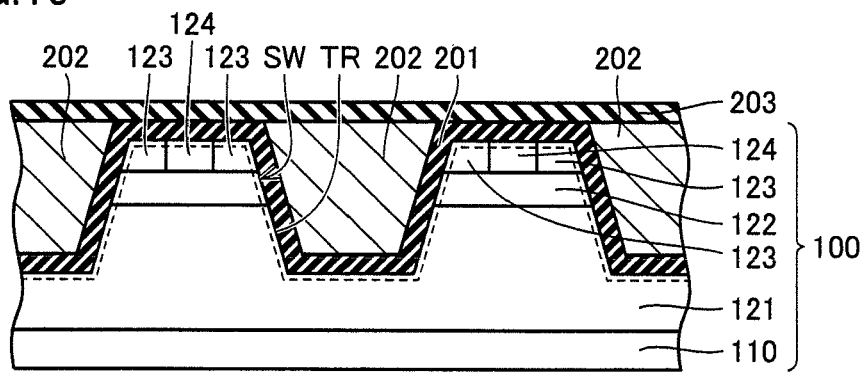
FIG. 16 is a partial cross-sectional view schematically showing a tenth step of the method of manufacturing the silicon carbide semiconductor device of FIG. 1.

As shown in FIG. 16, interlayer insulating film 203 is formed on gate electrode 202 and gate oxide film 201 to cover the exposed surfaces of gate electrode 202.

Figure 17:
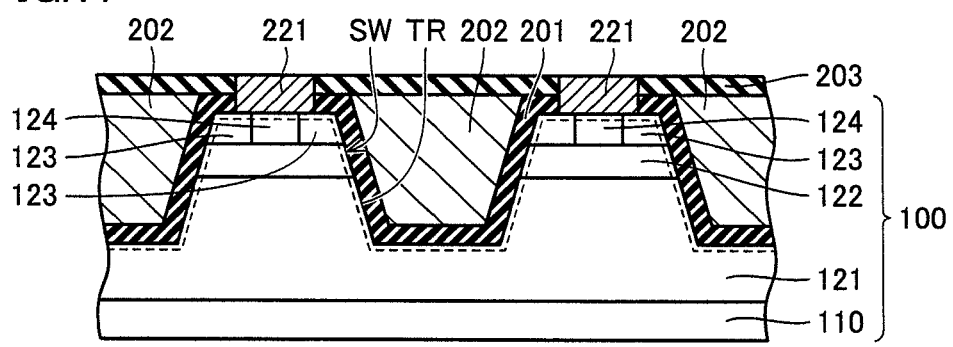
FIG. 17 is a partial cross-sectional view schematically showing an eleventh step of the method of manufacturing the silicon carbide semiconductor device of FIG. 1.

Referring to FIG. 17, etching is performed to form openings in interlayer insulating film 203 and gate oxide film 201. Through the openings, n region 123 and contact region 124 in the upper surfaces of the mesa structures are exposed. Next, in the upper surface of each mesa structure, source electrode 221 is formed in contact with n region 123 and contact region 124.

Referring again to FIG. 1, source line 222, drain electrode 211 and protection electrode 212 are formed. MOSFET 500 is thus obtained.

According to this embodiment, n⁻ layer 121 has a concentration peak of the donor along trench TR in a position away from trench TR, as indicated by the dashed line portion in n⁻ layer 121 (FIG. 4). Consequently, the electric field increases locally in the dashed line portion in the figure, causing the electric field to decrease in trench TR away from the dashed line portion. This also decreases the electric field applied to gate oxide film 201 provided on trench TR, to thereby improve the breakdown voltage of MOSFET 500.

According to an exemplary simulation performed by the present inventors, the electric field applied to gate oxide film 201 could be reduced from 7.8 MV/cm to 6.9 MV/cm in a corner portion of trench TR, by forming a concentration peak. In this simulation, n⁻ layer 121 was formed by implanting P ions in a dose amount of $1 \times 10^{12}/cm^2$ at an acceleration voltage of 400 keV into a layer having a donor concentration of $8 \times 10^{15}/cm^3$, after forming trench TR. The depth of trench TR was set to 1.8 μm. The drain voltage was set to 600 V.

According to this embodiment, the structure formed in the vicinity of trench TR for relaxing the electric field is the concentration peak of the donor in n⁻ layer 121 (FIG. 5), rather than the formation of a p type region. Thus, there is no possibility that such p type region comes too close to, or becomes connected to, p type body layer 122 which is also of p type, due to manufacturing variations. Thus, a step that requires high accuracy is not necessary. Accordingly, the electric field relaxation structure can be readily formed.

P type body layer 122 may have a concentration peak of the donor (FIG. 6) in a position away from trench TR in p type body layer 122. As a result, the effect of the donor on channel characteristics can be suppressed compared to a case where the concentration peak of the donor is on the surface of trench TR.

Concentration $n_{nG1}$ of the donor in n⁻ layer 121 at the bottom of trench TR may be not less than minimum value $n_{nD}$ of the donor concentration in n⁻ layer 121, and not more than 110% of the minimum value. As a result, the electric field can be relaxed more sufficiently.

At the bottom of trench TR, the profile of the concentration peak of the donor may have a dose amount of not less than $1 \times 10^{11}/cm^2$. As a result, the electric field can be relaxed more sufficiently.

Epitaxial substrate 100 may be made of silicon carbide having a hexagonal crystal structure of polytype 4H. As a result, a material more suitable for a power semiconductor device can be used.

While trench TR in this embodiment has a flat bottom, the shape of the trench is not limited as such, and the bottom may be a recess. For example, the trench may be in a V-shape.

While the first conductivity type is n type and the second conductivity type is p type in this embodiment, these conductivity types may be reversed. In this case, the above-described "concentration peak" corresponds to the concentration peak of the acceptor rather than the concentration peak of the donor. In order to further improve the channel mobility, however, the first conductivity type is preferably n type.

Furthermore, the silicon carbide semiconductor device may be a MISFET (Metal Insulator Semiconductor Field Effect Transistor) other than the MOSFET. Moreover, the silicon carbide semiconductor device is not limited to the MISFET as long as it has a trench gate structure. For example, the semiconductor device may be a trench type IGBT (Insulated Gate Bipolar Transistor).

(Surface Having Special Plane)

Figure 18:
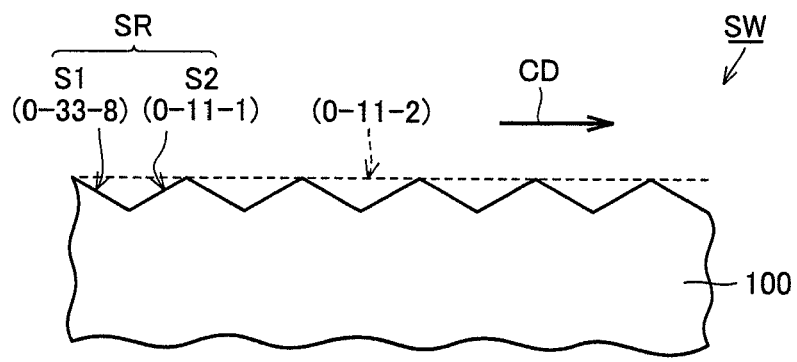
FIG. 18 is a partial cross-sectional view schematically showing a fine structure of a surface of the silicon carbide substrate included in the silicon carbide semiconductor device.

Surface SW of p type body layer 122 (FIG. 4) forming the channel surface is preferably a surface having a special plane. As shown in FIG. 18, such surface SW includes a plane S1 (first plane) having a plane orientation of {0-33-8}. Plane S1 preferably has a plane orientation of (0-33-8).

More preferably, surface SW includes plane S1 microscopically, and further includes a plane S2 (second plane) having a plane orientation of {0-11-1} microscopically. The term "microscopically" as used herein means "minutely to such an extent that at least the size about twice as large as an interatomic spacing is considered." As a method of observing such a microscopic structure, for example, a TEM (Transmission Electron Microscope) can be used. Plane S2 preferably has a plane orientation of (0-11-1).

Preferably, plane S1 and plane S2 of surface SW form a combined plane SR having a plane orientation of {0-11-2}. That is, combined plane SR is formed of periodically repeated planes S1 and S2. Such a periodic structure can be observed, for example, by TEM or AFM (Atomic Force Microscopy). In this case, combined plane SR macroscopically has an off angle of 62° relative to the {000-1} plane. The term "macroscopically" as used herein means "disregarding a fine structure having a size of approximately interatomic spacing." For the measurement of such a macroscopic off angle, a method employing general X-ray diffraction can be used, for example. Preferably, combined plane SR has a plane orientation of (0-11-2). In this case, combined plane SR macroscopically has an off angle of 62° relative to the (000-1) plane.

Preferably, in the channel surface, carriers flow in a channel direction CD, in which the above-described periodic repetition is done.

A detailed structure of combined plane SR is now described.

Figure 19:
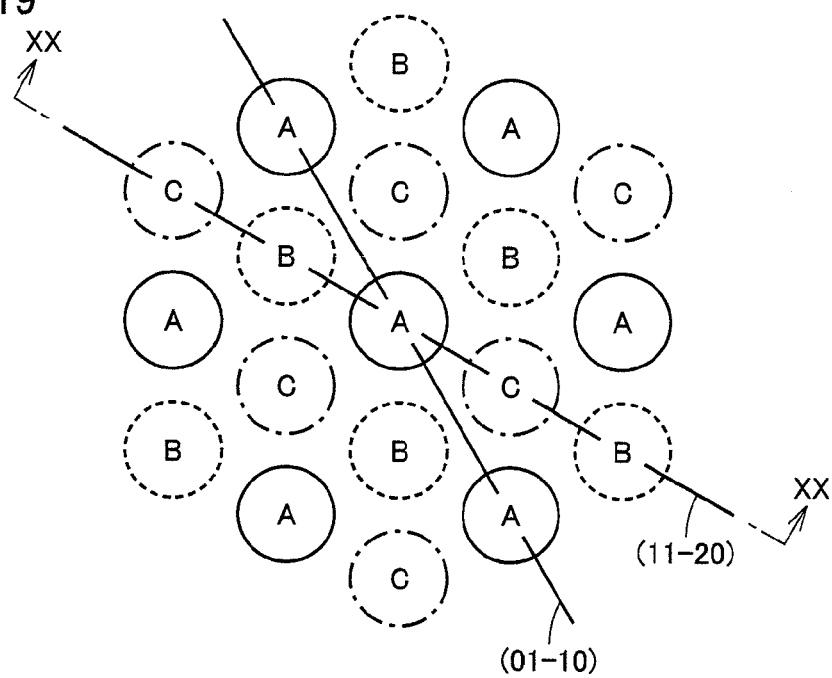
FIG. 19 shows a crystal structure of the (000-1) plane in a hexagonal crystal of polytype 4H.

Generally, regarding Si atoms (or C atoms), when a silicon carbide single crystal of polytype 4H is viewed from the (000-1) plane, atoms in a layer A (solid line in the figure), atoms in a layer B (broken line in the figure) disposed therebelow, atoms in a layer C (chain-dotted line in the figure) disposed therebelow, and atoms in a layer B (not shown) disposed therebelow are repeatedly provided as shown in FIG. 19. In other words, with four layers ABCB being regarded as one period, a periodic stacking structure such as ABCBABCBABCB . . . is provided.

Figure 20:
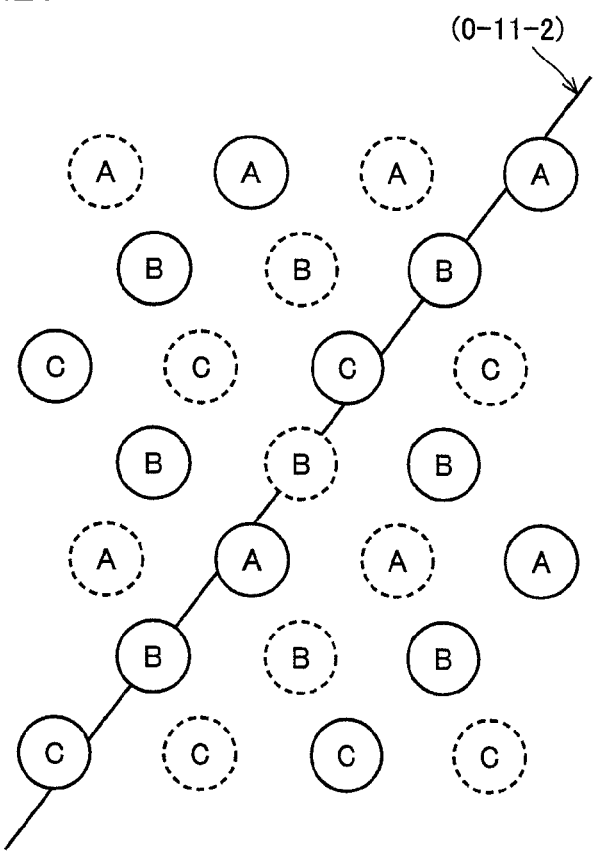
FIG. 20 shows a crystal structure of the (11-20) plane along a line XX-XX in FIG. 19.

As shown in FIG. 20, in the (11-20) plane (cross section taken along a line XX-XX in FIG. 19), the atoms in each of four layers ABCB constituting the above-described one period are not aligned completely along the (0-11-2) plane. In FIG. 20, the (0-11-2) plane is illustrated to pass through the locations of the atoms in layers B. In this case, it can be seen that each of the atoms in layers A and C is deviated from the (0-11-2) plane. Hence, even when the macroscopic plane orientation of the surface of the silicon carbide single crystal, i.e., the plane orientation thereof with its atomic level structure being disregarded, is limited to (0-11-2), this surface can have various structures microscopically.

Figure 21:
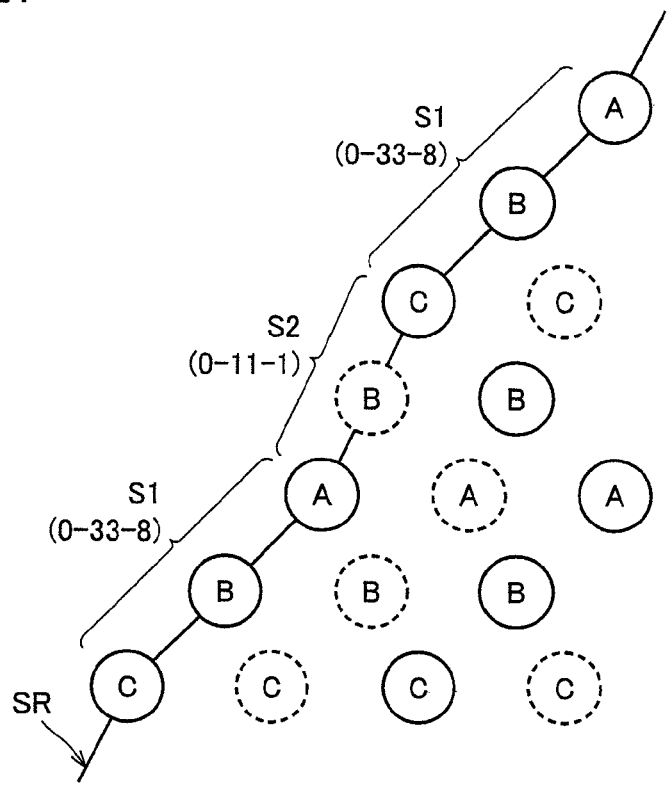
FIG. 21 shows a crystal structure in the (11-20) plane in the vicinity of a surface of a combined plane of FIG. 18.

As shown in FIG. 21, combined plane SR is formed by alternately providing planes S1 having a plane orientation of (0-33-8) and planes S2 connected to planes S1 and having a plane orientation different from that of planes S1. Each of planes S1 and S2 has a length twice as large as the interatomic spacing of the Si atoms (or C atoms). It is noted that a plane with plane S1 and plane S2 being averaged corresponds to the (0-11-2) plane (FIG. 20).

Figure 22:
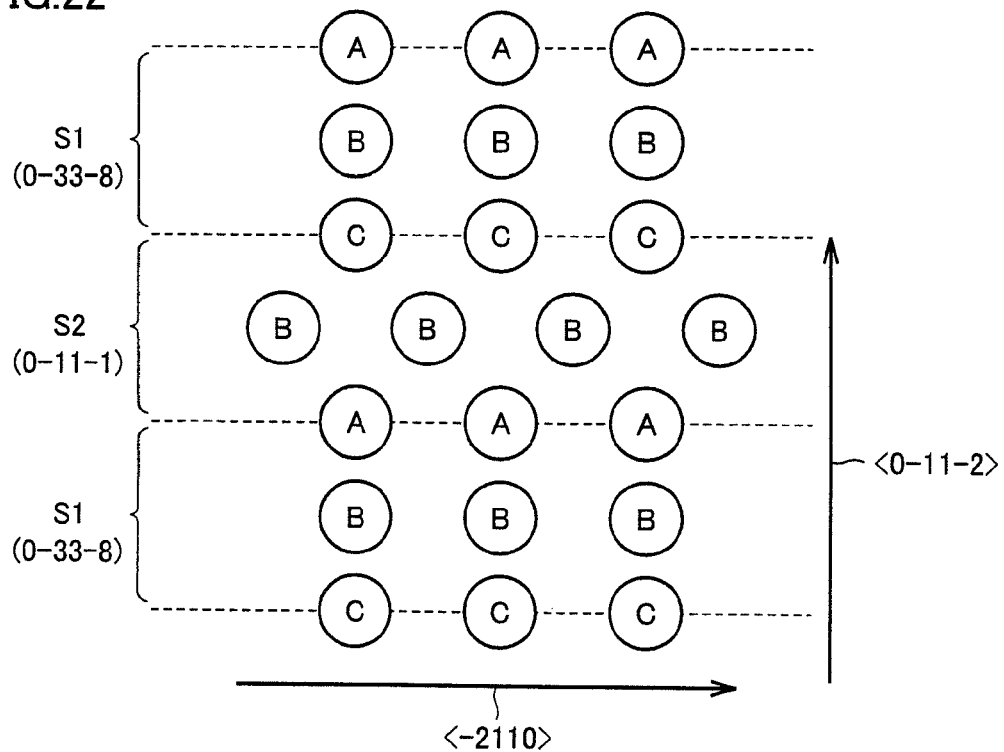
FIG. 22 shows the combined plane of FIG. 18 when viewed from the (01-10) plane.

As shown in FIG. 22, when combined plane SR is viewed from the (01-10) plane, the single-crystal structure has a portion periodically including a structure (the portion of plane S1) equivalent to a cubic structure. Specifically, combined plane SR is formed by alternately providing planes S1 having a plane orientation of (001) in the above-described structure equivalent to a cubic structure and planes S2 connected to planes S1 and having a plane orientation different from that of planes S1. Also in polytype other than 4H, the surface can be thus formed of the planes (planes S1 in FIG. 22) having a plane orientation of (001) in the structure equivalent to a cubic structure and the planes (planes S2 in FIG. 22) connected to the foregoing planes and having a plane orientation different from that of the foregoing planes. The polytype may be 6H or 15R, for example.

Figure 23:
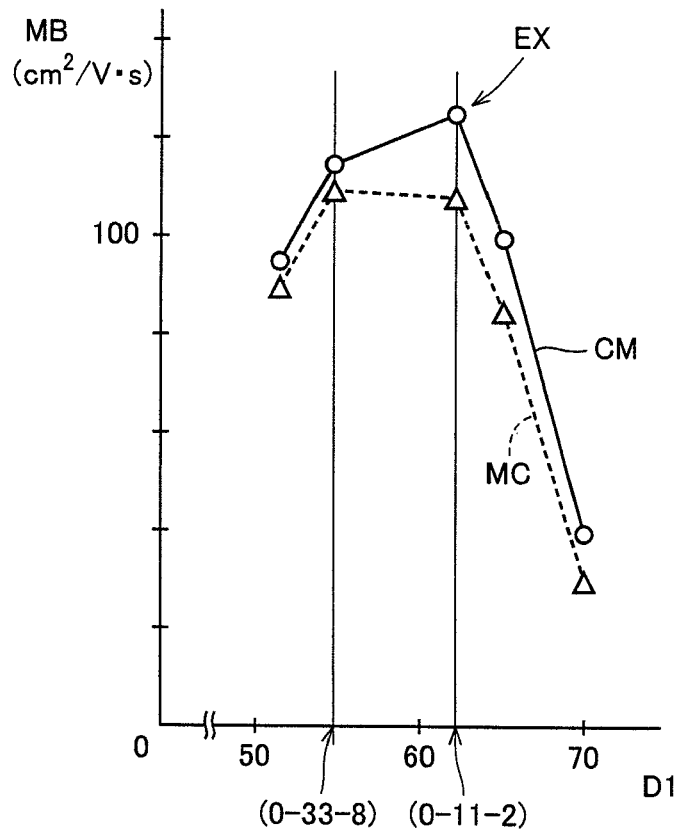
FIG. 23 is a graph chart showing one exemplary relation between channel mobility and an angle between the channel surface and the (000-1) plane when viewed macroscopically, in each of a case where thermal etching is performed and a case where thermal etching is not performed.

Referring now to FIG. 23, relation between the crystal plane of surface SW and mobility MB in the channel surface is described. In the graph of FIG. 23, the horizontal axis represents an angle D1 formed by the (000-1) plane and the macroscopic plane orientation of surface SW having the channel surface, and the vertical axis represents mobility MB. A group of plots CM corresponds to a case where surface SW is finished to have the special plane through thermal etching, and a group of plots MC corresponds to a case where surface SW is not subjected to such thermal etching.

In group of plots MC, mobility MB is at maximum when the surface of the channel surface has a macroscopic plane orientation of (0-33-8). This is presumably due to the following reason. That is, in the case where the thermal etching is not performed, i.e., in the case where the microscopic structure of the channel surface is not particularly controlled, the macroscopic plane orientation thereof corresponds to (0-33-8), with the result that a ratio of the microscopic plane orientation of (0-33-8), i.e., the plane orientation of (0-33-8) in consideration of that in atomic level, becomes statistically high.

On the other hand, mobility MB in group of plots CM is at maximum when the macroscopic plane orientation of the surface of the channel surface is (0-11-2) (arrow EX). This is presumably due to the following reason. That is, as shown in FIGS. 21 and 22, the large number of planes S1 each having a plane orientation of (0-33-8) are densely and regularly arranged with planes S2 interposed therebetween, whereby a ratio of the microscopic plane orientation of (0-33-8) becomes high in the surface of the channel surface.

Figure 24:
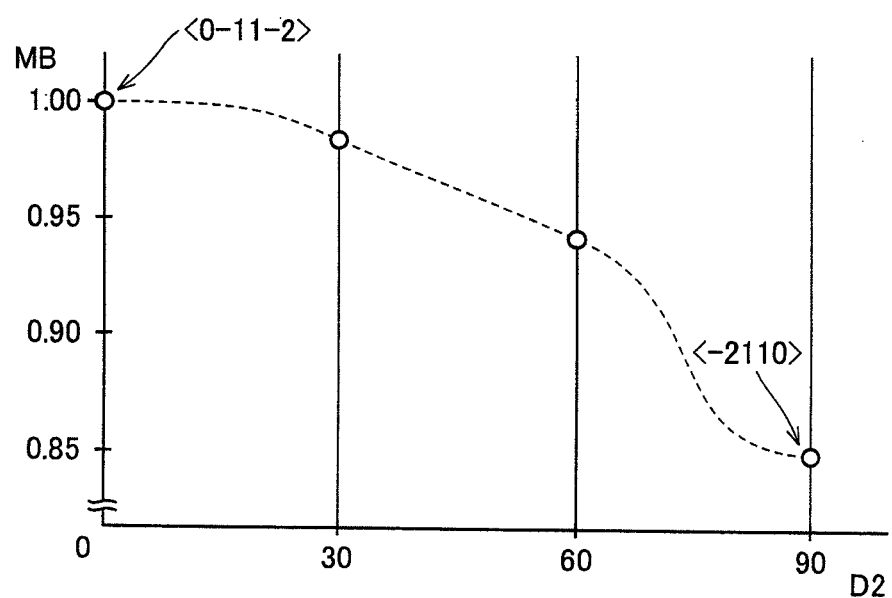
FIG. 24 is a graph chart showing one exemplary relation between channel mobility and an angle between the channel direction and the <0-11-2> direction.

It is noted that mobility MB has orientation dependency on combined plane SR. In a graph shown in FIG. 24, the horizontal axis represents an angle D2 between the channel direction and the <0-11-2> direction, and the vertical axis represents mobility MB (in any unit) in the channel surface. A broken line is supplementarily provided therein for viewability of the graph. It has been found from this graph that in order to increase channel mobility MB, channel direction CD (FIG. 18) preferably has an angle D2 of not less than 0° and not more than 60°, and more preferably, substantially 0°.

Figure 25:
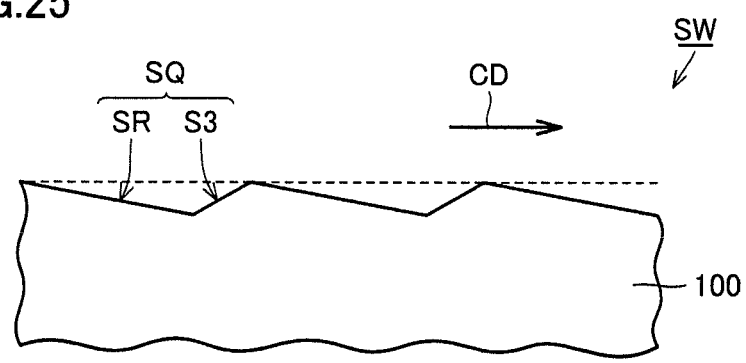
FIG. 25 shows a variation of FIG. 18.

As shown in FIG. 25, surface SW may further include a plane S3 (third plane) in addition to combined plane SR. More specifically, surface SW may include a combined plane SQ formed of periodically repeated planes S3 and combined planes SR. In this case, the off angle of surface SW relative to the {000-1} plane is deviated from the ideal off angle of combined plane SR, i.e., 62°. This deviation is preferably small, and preferably in a range of ±10°. Examples of a surface included in such an angle range include a surface having a macroscopic plane orientation of the {0-33-8} plane. More preferably, the off angle of surface SW relative to the (000-1) plane is deviated from the ideal off angle of combined plane SR, i.e., 62°. This deviation is preferably small, and preferably in a range of ±10°. Examples of a surface included in such an angle range include a surface having a macroscopic plane orientation of the (0-33-8) plane.

Such a periodic structure can be observed, for example, by TEM or AFM.

Although the present invention has been described and illustrated in detail, it is clearly understood that the same is by way of illustration and example only and is not to be taken by way of limitation, the scope of the present invention being interpreted by the terms of the appended claims.

What is claimed is:
1. A silicon carbide semiconductor device comprising:
a silicon carbide substrate including a first layer of a first conductivity type, a second layer of a second conductivity type provided on said first layer, and a third layer provided on said second layer and doped with an impurity for providing said first conductivity type, said silicon carbide substrate having a trench formed through said third layer and said second layer to reach said first layer, said first layer having a concentration peak of said impurity in a position away from said trench and along said trench in said first layer;

a gate insulating film covering said trench; and a gate electrode provided on said gate insulating film, said gate electrode facing a surface of said second layer, with said gate insulating film interposed therebetween, wherein said second layer has a concentration peak of said impurity in a position away from said trench in said second layer.

2. A silicon carbide semiconductor device comprising:

a silicon carbide substrate including a first layer of a first conductivity type, a second layer of a second conductivity type provided on said first layer, and a third layer provided on said second layer and doped with an impurity for providing said first conductivity type, said silicon carbide substrate having a trench formed through said third layer and said second layer to reach said first layer, said first layer having a concentration peak of said impurity in a position away from said trench and along said trench in said first layer;

a gate insulating film covering said trench; and a gate electrode provided on said gate insulating film, said gate electrode facing a surface of said second layer, with said gate insulating film interposed therebetween, wherein the concentration of said impurity in said first layer at the bottom of said trench is not less than a minimum value of the concentration of said impurity in said first layer, and not more than 110% of said minimum value.

3. The silicon carbide semiconductor device according to claim 1, wherein at the bottom of said trench, a profile of said concentration peak of said impurity has a dose amount of not less than $1 \times 10^{11}/cm^2$.

4. The silicon carbide semiconductor device according to claim 1, wherein said silicon carbide substrate is made of silicon carbide having a hexagonal crystal structure of polytype 4H.

5. A silicon carbide semiconductor device comprising:

a silicon carbide substrate including a first layer of a first conductivity type, a second layer of a second conductivity type provided on said first layer, and a third layer provided on said second layer and doped with an impurity for providing said first conductivity type, said silicon carbide substrate having a trench formed through said third layer and said second layer to reach said first layer, said first layer having a concentration peak of said impurity in a position away from said trench and along said trench in said first layer;

a gate insulating film covering said trench; and a gate electrode provided on said gate insulating film, said gate electrode facing a surface of said second layer, with said gate insulating film interposed therebetween, said second layer has a concentration peak of said impurity in a position away from said trench in said second layer, wherein said silicon carbide substrate is made of silicon carbide having a hexagonal crystal structure of polytype 4H, and wherein said surface of said second layer includes a first plane having a plane orientation of {0-33-8}.

6. The silicon carbide semiconductor device according to claim 5, wherein said surface includes said first plane microscopically, and further includes a second plane having a plane orientation of {0-11-1} microscopically.

7. The silicon carbide semiconductor device according to claim 6, wherein said first and second planes of said surface form a combined plane having a plane orientation of {0-11-2}.

8. The silicon carbide semiconductor device according to claim 7, wherein said surface macroscopically has an off angle of 62°±10° relative to the {000-1} plane.

9. The silicon carbide semiconductor device according to claim 2, wherein at the bottom of said trench, a profile of said concentration peak of said impurity has a dose amount of not less than $1 \times 10^{11}/cm^2$.

* * * * *